(12) United States Patent
Lin et al.

(10) Patent No.: US 12,114,460 B2
(45) Date of Patent: Oct. 8, 2024

(54) OUTDOOR ELECTRONIC DEVICE

(71) Applicant: PEGATRON CORPORATION, Taipei (TW)

(72) Inventors: Kai-Ling Lin, Taipei (TW); Chin-Chien Chang, Taipei (TW); Chia-Chieh Hu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 18/366,178

(22) Filed: Aug. 7, 2023

(65) Prior Publication Data
US 2024/0206108 A1   Jun. 20, 2024

(30) Foreign Application Priority Data

Dec. 19, 2022   (TW) .................................. 111148805

(51) Int. Cl.
| | | |
|---|---|---|
| *F21S 8/08* | (2006.01) | |
| *F21V 29/67* | (2015.01) | |
| *H05K 7/20* | (2006.01) | |
| *F21W 131/103* | (2006.01) | |

(52) U.S. Cl.
CPC .......... *H05K 7/20136* (2013.01); *F21S 8/085* (2013.01); *F21V 29/67* (2015.01); *F21W 2131/103* (2013.01)

(58) Field of Classification Search
CPC ............ F21S 8/085; F21S 8/086; F21S 8/088; F21W 2131/103; F21V 29/67; F21V 29/673; F21V 29/677
See application file for complete search history.

(56) References Cited

U.S. PATENT DOCUMENTS

| | | | |
|---|---|---|---|
| 2009/0244901 A1* | 10/2009 | Hu .......................... | F21S 8/086 |
| | | | 362/294 |
| 2014/0182811 A1* | 7/2014 | Hager ..................... | H01Q 1/02 |
| | | | 165/104.34 |

FOREIGN PATENT DOCUMENTS

| | | |
|---|---|---|
| CN | 207527446 U | 6/2018 |
| CN | 211481665 U | 9/2020 |
| CN | 211731087 U | 10/2020 |

* cited by examiner

*Primary Examiner* — Sean P Gramling
(74) *Attorney, Agent, or Firm* — McClure, Qualey & Rodack, LLP

(57) ABSTRACT

The present disclosure provides an outdoor electronic device including a shell, electronic assemblies, a rod body and a blower fan. The electronic assemblies are arranged in the shell. The rod body is of a hollow structure and includes a first end and a second end which are reversely arranged; and the first end is connected to the shell. At least one part of the blower fan is arranged on the rod body and includes an air inlet port and an air outlet port. The air inlet port extends to a position close to the electronic assemblies in the shell. The air outlet port is positioned in the rod body and is closer to the second end than the air inlet port.

20 Claims, 4 Drawing Sheets

OUTDOOR ELECTRONIC DEVICE

CROSS-REFERENCE TO RELATED APPLICATION

This application claims the priority benefit of Taiwan application serial no. 111148805, filed on Dec. 19, 2022. The entirety of the above-mentioned patent application is hereby incorporated by reference herein and made a part of this specification.

TECHNICAL FIELD

The present disclosure relates to outdoor electronic devices, and particularly relates to an outdoor electronic device having a heat exchange mechanism.

BACKGROUND

Various electronic devices are widely used in daily life, which are provided with various electronic assemblies to perform different functions. With the improvement of the performance of the electronic devices, the number of electronic assemblies in the electronic devices also increases. However, the heat energy generated by the electronic assemblies in the electronic devices during operation is also increasing, and excessive heat energy is one of the factors that affect the normal operation of the electronic assemblies. As a result, the electronic devices are usually provided with ventilation holes penetrating through the inner parts and being close to the electronic assemblies inside to facilitate heat dissipation.

However, since the electronic assemblies are driven by electric power, it is necessary to ensure their waterproofness to avoid damage to the electronic assemblies during the operation of the electronic devices. Therefore, when the electronic devices are used outdoors, they need to meet the requirements of heat dissipation and waterproofness, which pose design difficulties.

SUMMARY

The present disclosure provides an outdoor electronic device including a shell, electronic assemblies, a rod body and a blower fan. The electronic assemblies are arranged in the shell. The rod body is of a hollow structure and includes a first end and a second end which are reversely arranged; and the first end is connected to the shell. At least one part of the blower fan is arranged on the rod body and includes an air inlet port and an air outlet port. The air inlet port extends to a position close to the electronic assemblies. The air outlet port is positioned in the rod body.

Therefore, hot air generated by the electronic assemblies in the outdoor electronic device during operation can be pumped by the air inlet port of the blower fan. The hot air is pumped by the blower fan and then is discharged to the rod body by the air outlet port. The hot air pumped into the rod body by the blower fan is in contact with the large-area rod body for heat exchange. Meanwhile, cold air in the rod body can be naturally circulated and supplemented into the shell so as to make heat dissipation effect on the shell, thus normal operation of the electronic assemblies is kept, and the operational stability of the outdoor electronic device is improved.

In some embodiments, the above rod body is made of a high-thermal-conductivity material.

In some embodiments, a direction of connecting the first end and the second end of the above rod body is a vertical direction. The shell has a first length in the vertical direction. The rod body has a second length in the vertical direction. The second length is greater than the first length.

In some embodiments, the outdoor electronic device further includes a rod bottom chassis arranged at the second end of the rod body. The rod bottom chassis is of a hollow structure, and the rod bottom chassis communicates with the interior of the rod body. A plurality of electronic assemblies is provided, and one electronic assembly is arranged in the rod bottom chassis.

In some embodiments, the above rod bottom chassis has a third length in the vertical direction, and the second length is greater than the sum of the first length and the third length.

In some embodiments, the above second length is 1.5-2 times of the sum of the first length and the third length.

In some embodiments, the above rod bottom chassis further includes an open hole. The open hole is formed in a position, which is located at the farthest position away from the shell in the vertical direction of the entire outdoor electronic device In some embodiments, the above blower fan includes a first blower fan body and a second blower fan body. The first blower fan body includes a first air inlet port and a first air outlet port. The second blower fan body includes a second air inlet port and a second air outlet port. The first air inlet port extends to a position close to the electronic assemblies in the shell. The first air outlet port is positioned in the rod body and is closer to the second end than the first air inlet port. The second air outlet port is positioned in the rod body and is closer to the first end than the second air inlet port. The second air inlet port extends into the rod bottom chassis.

In some embodiments, the above electronic assemblies are light sources.

In some embodiments, the above shell includes a light transmitting part. The electronic assemblies are at positions corresponding to the light transmitting part in the shell.

In some embodiments, the above electronic assemblies are communication devices.

In some embodiments, the above shell further includes a light shielding part. The electronic assemblies are at positions corresponding to the light shielding part in the shell.

In some embodiments, the above shell includes a light transmitting part and a light shielding part which are connected to each other. The electronic assemblies include a first electronic assembly and a second electronic assembly. The first electronic assembly is at a position corresponding to the light transmitting part in the shell. The second electronic assembly is at a position corresponding to the light shielding part in the shell. The first electronic assembly is a light source. The second electronic assembly is a communication device.

In some embodiments, the above light transmitting part is positioned at the first end away from the rod body relative to the light shielding part.

In some embodiments, the above shell further includes a partition plate. The partition plate is arranged in the shell. The electronic assemblies include a first electronic assembly and a second electronic assembly. The first electronic assembly and the second electronic assembly are respectively positioned on two sides of the partition plate.

DETAILED DESCRIPTION

Figure 1:
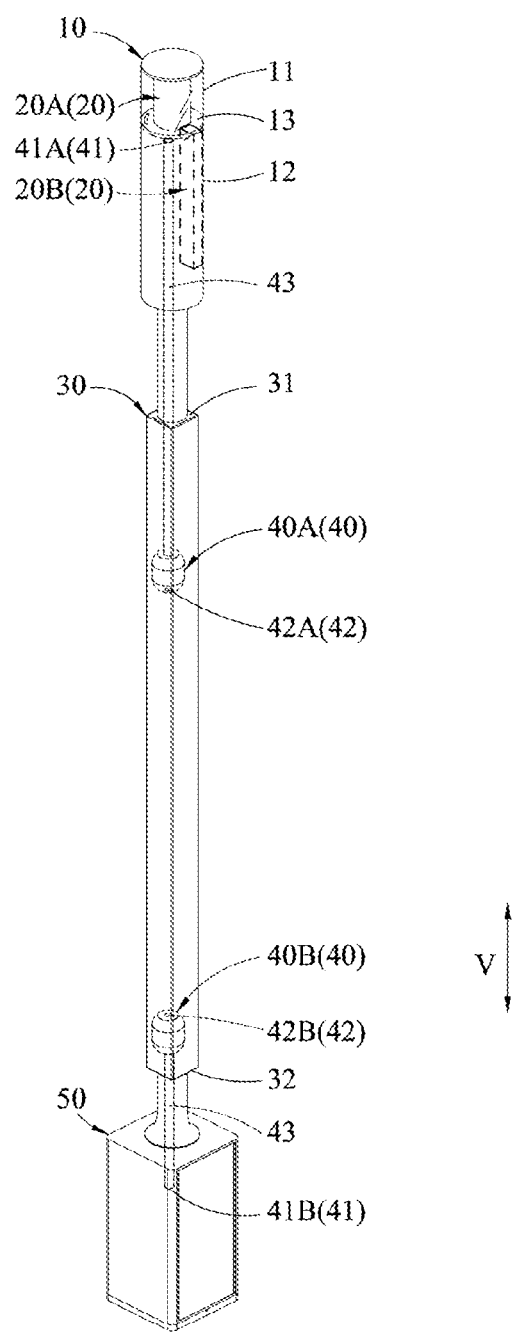
FIG. 1 is a schematic appearance diagram of an embodiment of an outdoor electronic device according to the present disclosure.
Figure 2:
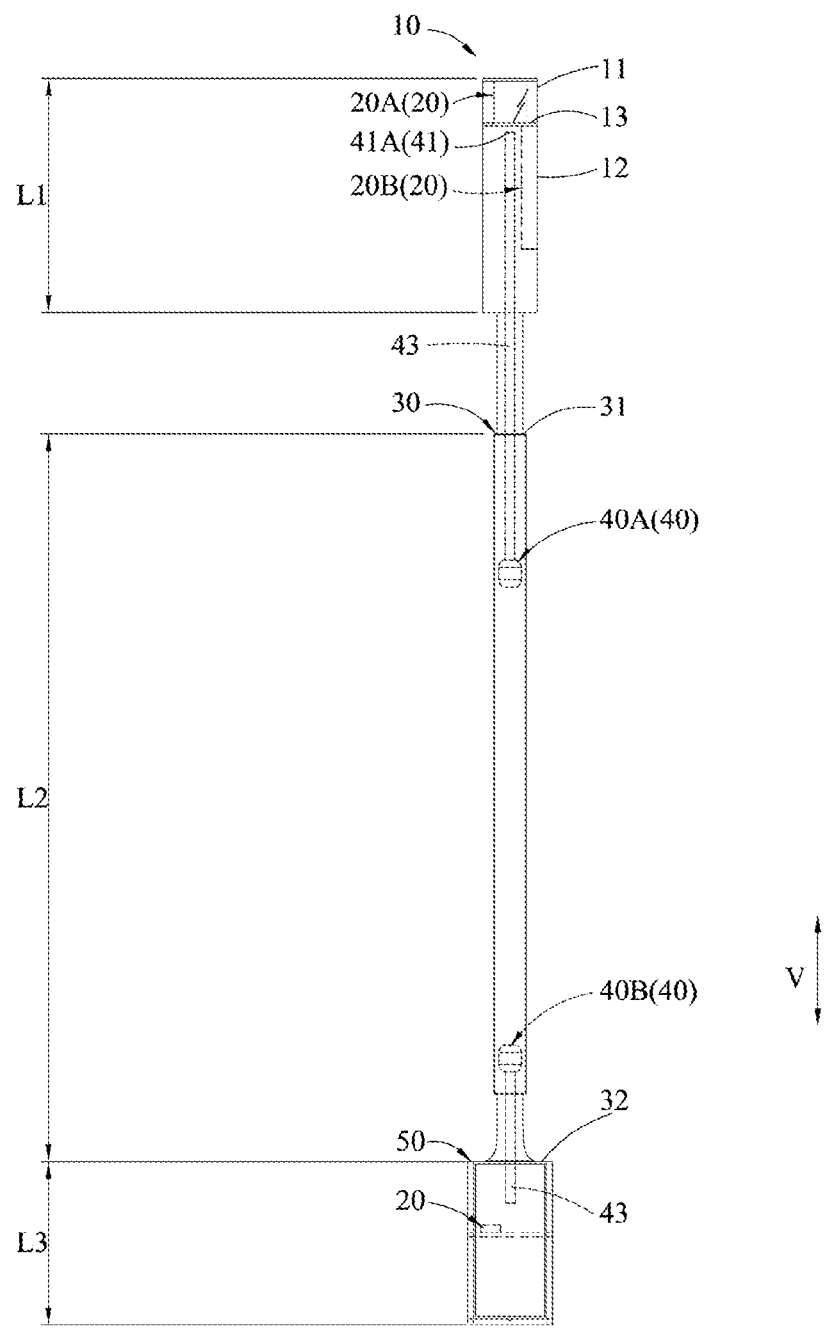
FIG. 2 is a schematic plane diagram of an embodiment of an outdoor electronic device according to the present disclosure.
Figure 3:
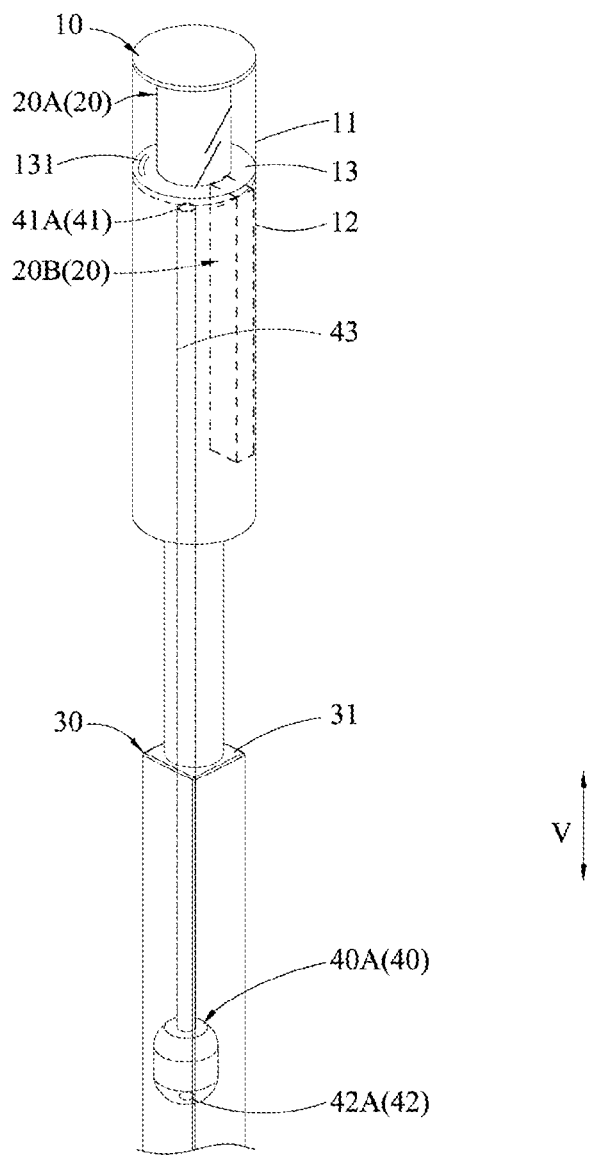
FIG. 3 is a schematic local diagram 1 of an embodiment of an outdoor electronic device according to the present disclosure.
Figure 4:
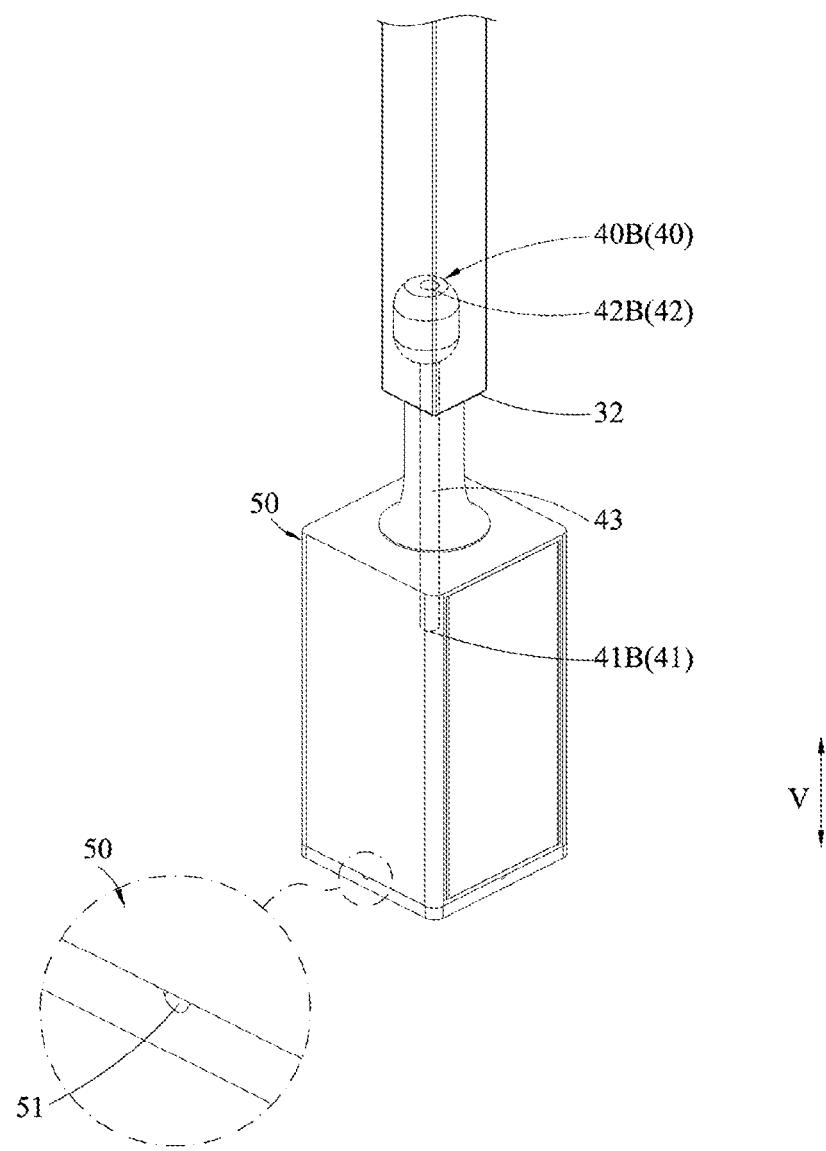
FIG. 4 is a schematic local diagram 2 of an embodiment of an outdoor electronic device according to the present disclosure.

Referring to FIG. 1 to FIG. 4, FIG. 1 is a schematic appearance diagram of an embodiment of an outdoor electronic device according to the present disclosure. FIG. 2 is a schematic plane diagram of an embodiment of an outdoor electronic device according to the present disclosure. FIG. 3 is a schematic local diagram 1 of an embodiment of an outdoor electronic device according to the present disclosure. FIG. 4 is a schematic local diagram 2 of an embodiment of an outdoor electronic device according to the present disclosure. An outdoor electronic device according to the present disclosure is vertically arranged outdoors for use, and the outdoor electronic device can provide different functional services according to the states of electronic assemblies 20 inside. In some embodiments, the electronic assemblies 20 may be selected from one or a combination of a light source, a communication device, a charging device, a warning device or a display apparatus, and are not limited by the above.

Referring to FIG. 1 to FIG. 4, the outdoor electronic device according to the present disclosure includes a shell 10, electronic assemblies 20, a rod body 30 and a blower fan 40. The electronic assemblies 20 are arranged in the shell 10. The rod body 30 includes a first end 31 and a second end 32 which are reversely arranged. The first end 31 is connected to the shell 10. At least one part of the blower fan 40 is arranged on the rod body 30 and includes an air inlet port 41 and an air outlet port 42. The air inlet port 41 extends to a position close to the electronic assemblies 20. The air outlet port 42 is positioned in the rod body 30.

Therefore, air in the shell 10 is heated to become high-temperature air by heat energy generated by the electronic assemblies 20 in the outdoor electronic device during operation in the shell 10. The high-temperature air is pumped into the blower fan 40 through the air inlet port 41. The shell 10 is in a low-pressure state relative to the rod body 30. Meanwhile, the high-temperature air pumped by the blower fan 40 is discharged into the rod body 30 through the air outlet port 42. Hot air discharged into the rod body 30 by the blower fan 40 is in contact with the large-area rod body 30 for heat exchange. Meanwhile, original low-temperature air in the rod body 30 can be naturally circulated and supplemented into the shell 10 so as to make heat dissipation effect on the electronic assemblies 20 in the shell 10, thus normal operation of the electronic assemblies 20 is kept, and the stability of the outdoor electronic device is improved. In addition, it is to be noted that the outdoor electronic device conducts heat exchange with the outside through the large-area rod body 30, so the heat dissipation effect can be achieved without forming heat dissipation holes in the shell 10, the waterproof and dustproof performance of all internal space can be better guaranteed, and the stability of the device is improved.

Referring to FIG. 1 and FIG. 2, a vertical arrangement mode of the outdoor electronic device according to the present disclosure refers to a mode that the rod body 30 is upright at a use position. In some embodiments, the outdoor electronic device is arranged on the ground for use. In such embodiments, a direction of connecting the first end 31 and the second end 32 of the rod body 30 is a vertical direction V. When the rod body 30 of the outdoor electronic device is in an upright state relative to the ground, the second end 32 of the rod body 30 is close to the ground, and the first end 31 of the rod body 30 is far away from the ground. Therefore, the electronic assemblies 20 are also at positions far away from the ground along with the shell 10 connected to the first end 31 of the rod body 30, and thus the outdoor electronic device can be used as an outdoor electronic device meeting requirement of configuring the electronic assemblies 20 at high positions.

In some embodiments, the electronic assemblies 20 are light sources, so the outdoor electronic device can be used as a street light. The electronic assemblies 20 are communication devices, so the outdoor electronic device can be used as a base station. The electronic assemblies 20 include the light sources and the communication devices at the same time, so the outdoor electronic device can be used as a smart street light. The electronic assemblies 20 include a charging device, so the outdoor electronic device can be used as a charging pile. It is to be noted that the configuration and the types of the electronic assemblies 20 are not limited by the above. When the use fields or requirements of the outdoor electronic device are different, the electronic assemblies 20 in the outdoor electronic device may also be a combination of the above different electronic assemblies 20 or additionally arranged other electronic assemblies.

Referring to FIG. 1 and FIG. 3, the shell 10 is of a hollow structure body for accommodating the electronic assemblies 20. In some embodiments, the outdoor electronic device is used as the street light, and the electronic assemblies 20 are the light sources (such as but not limited to LED light sources). In such embodiments, the shell 10 includes a light transmitting part 11, and the electronic assemblies 20 are at the positions corresponding to the light transmitting part 11 in the shell 10, and thus the electronic assemblies 20 in a light source type can emit light rays through the light transmitting part 11 for illumination.

Referring to FIG. 1 and FIG. 3, in some embodiments, the outdoor electronic device is used as the base station, and the electronic assemblies 20 are the communication devices (such as but not limited to 5G wireless devices). In such embodiments, the shell 10 includes a light shielding part 12, and the electronic assemblies 20 are at positions corresponding to the light shielding part 12 in the shell 10, so that the electronic assemblies 20 are prevented from being directly irradiated by sunlight, and the degradation and loss of the electronic assemblies 20 are reduced.

Referring to FIG. 1 and FIG. 3, in some embodiments, the outdoor electronic device is used as the smart street light. The electronic assemblies 20 include a first electronic assembly 20A and a second electronic assembly 20B. The first electronic assembly 20A is the light source, and the second electronic assembly 20B is the communication device. The shell 10 includes the light transmitting part 11 and the light shielding part 12 which are connected to each other. The first electronic assembly 20A is at a position corresponding to the light transmitting part 11 in the shell 10. The second electronic assembly 20B is at a position corresponding to the light shielding part 12 in the shell 10. Therefore, the outdoor electronic device can provide illumination and can also be used as a communication base station.

Referring to FIG. 1 and FIG. 2, in some embodiments that the electronic assemblies 20 include the first electronic assembly 20A and the second electronic assembly 20B, the light transmitting part 11 of the shell 10 is far away from the first end 31 of the rod body 30 relative to the light shielding part 12. Therefore, when the outdoor electronic device is mounted and used in a mode that the second end 32 of the rod body 30 is close to the mounting position, the light transmitting part 11 of the shell 10 is the position, farthest away from the second end 32 of the rod body 30 in the vertical direction V, of the whole outdoor electronic device. When the outdoor electronic device is arranged on the ground for use, the first electronic assembly 20A in a light source type can be at the highest position of the outdoor electronic device so as to provide illumination in the widest range.

Referring to FIG. 1 to FIG. 4, the blower fan 40 includes an air inlet port 41 and an air outlet port 42. The air inlet port 41 is configured to pump air. The air outlet port 42 is pumped to discharge the pumped air. In some embodiments, the blower fan 40 is matched with a pipe body 43 for use so as to extend the air inlet port 41 to a required position. In such embodiments, the pipe body 43 is of a pipe body structure with two communicated ends. One end of the pipe body 43 is connected to the air inlet port 41 of the blower fan 40, and therefore the other end of the pipe body 43 extends to the air inlet port 41.

Referring to FIG. 1 to FIG. 4, in such embodiments, the blower fan 40 is arranged in the rod body 30, then the air inlet port 41 extends to a position close to the electronic assemblies 20 in the shell 10 through the pipe body 43, and the air outlet port 42 of the blower fan 40 is directly positioned in the rod body 30. It is to be noted that the blower fan 40 is not limited to extend the air inlet port 41 into the shell 10 through the pipe body 43. Because the blower fan 40 is provided with the air inlet port 41, the blower fan 40 may also be directly arranged in the shell 10 in a case of enough space in the shell 10. Air in the shell 10 can be directly pumped through the air inlet port 41 of the blower fan 40. In the same way, the air outlet port 42 of the blower fan 40 is not limited to be directly positioned in the rod body 30. When the space configuration requirement in the rod body 30 is changed, the blower fan 40 may also extend the air outlet port 42 to a required configuration position by connecting the pipe body 43.

Referring to FIG. 1 and FIG. 3, in some embodiments that the electronic assemblies 20 include the first electronic assembly 20A and the second electronic assembly 20B, the shell 10 further includes a partition plate 13, and the partition plate 13 is arranged in the shell 10. In such embodiments, the first electronic assembly 20A and the second electronic assembly 20 may be respectively arranged at two sides of the partition plate 13, such that the assembling of the first electronic assembly 20A and the second electronic assembly 20 is facilitated, and the stability of the first electronic assembly 20A and the second electronic assembly 20B can also be improved.

Referring to FIG. 1 and FIG. 3, in some embodiments that the shell 10 includes the partition plate 13, the partition plate 13 includes a through port 131, and the through port 131 is used for communicating space at two sides of the partition plate 13. In such embodiments, the two sides of the partition plate 13 may be respectively provided with the first electronic assembly 20A and the second electronic assembly 20B. The air inlet port 41 of the blower fan 40 is not limited to extend to one side, which is provided with the first electronic assembly 20A, of the partition plate 13 or one side, which is provided with the second electronic assembly 20B, of the partition plate 13. Air at the two sides of the partition plate 13 is enabled to keep circulation through the through port 131 of the partition plate 13 so that the air can be pumped to the rod body 30 by the blower fan 40 through the air inlet port 41 for heat exchange.

In some embodiments, the rod body 30 is made of a high-thermal-conductivity material. In some embodiments, the rod body 30 may be made of but not limited to a metal material or a high-thermal-conductivity plastic material. Therefore, through the selection of the material of the rod body 30, the efficiency of heat exchange between air in the rod body 30 and the rod body 30 is improved.

Referring to FIG. 2, the shell 10 has a first length L1 in the vertical direction V. The rod body 30 has a second length L2 in the vertical direction V. In some embodiments, the second length L2 is greater than the first length L1. Therefore, the heat sources (electronic assemblies 20) in the outdoor electronic device are arranged in the shell 10. When the electronic assemblies 20 are in operation, the temperature of air in the rod body 30 is lower than that of air in the shell 10. In such embodiments, the second length L2 is greater than the first length L1, so that the internal space of the rod body 30 is ensured to be greater than that of the shell 10, and as a result, the content of low-temperature air in the rod body 30 is increased, and the heat exchange efficiency in the rod body 30 is improved.

In some embodiments, an extension section is further arranged between the shell 10 and the rod body 30. The extension section is a hollow structure body and extends along the vertical direction V. The extension section is connected between the first end 31 of the rod body 30 and the shell 10, so that a height position of the shell 10 in the vertical direction V can be extended by the extension section to meet the height requirements of different outdoor electronic devices.

In some embodiments, the outdoor electronic device further includes a rod bottom chassis 50. The rod bottom chassis 50 is of a hollow structure and is arranged at the second end 32 of the rod body 30 and used for accommodating other electronic assemblies 20. In such embodiments, the electronic assemblies 20 of the outdoor electronic device may be distributed in the shell 10 and the rod bottom chassis 50. In a case of the electronic assemblies 20 serving as the light sources, light-emitting elements which mainly generate light rays in the light sources are arranged in the shell 10 related to an illumination range. The electronic assemblies 20 (such as a controller or a power supply thereof) for driving or controlling the light sources may be configured in the rod bottom chassis 50. The rod body 30 may provide configuration of physical circuits required by electrical connection of the light-emitting elements, the controller and the power supply thereof, thus the configuration space of the electronic assemblies 20 is increased, the number and the types of the electronic assemblies 20 configured in the outdoor electronic device are increased, and the performance of the outdoor electronic device is increased.

Referring to FIG. 2 and FIG. 4, in some embodiments, the rod bottom chassis 50 further includes an open hole 51. The open hole 51 is formed in a position, farthest away from the second end 32 of the rod body 30 in the vertical direction V, of the rod bottom chassis 50 in a penetrating mode, and therefore the open hole 51 of the rod bottom chassis 50 is positioned in the lowest position of the whole outdoor electronic device in the vertical direction V. When water vapor or even liquid invades the outdoor electronic device, the water vapor or the liquid can leave all internal space in the outdoor electronic device through the open hole 51, it is guaranteed that no water vapor or liquid is left in all the internal space in the outdoor electronic device, the electronic assemblies 20 arranged in all the internal space in the outdoor electronic device are prevented from making contact with the water vapor or the liquid, and thus the operation stability of the whole device is improved.

In such embodiments, the open hole 51 penetrates through the rod bottom chassis 50, and the interior of the rod bottom chassis 50 communicates with the interior of the rod body 30. Therefore, when the electronic assemblies 20 in the outdoor electronic device are operated to enable the temperature of air in the internal space to rise, air outside the outdoor electronic device may also enter the rod bottom chassis 50 of the outdoor electronic device through the open hole 51 for natural air exchange, and the overall heat exchange efficiency can be improved.

In some embodiments that the outdoor electronic device includes the rod bottom chassis 50, the electronic assemblies 20 may also be arranged in the rod bottom chassis 50. When the electronic assemblies 20 in the rod bottom chassis 50 are in operation, the temperature of air in the rod bottom chassis 50 rises. When the temperature of the air in the rod bottom chassis 50 rises, the density of high-temperature air is reduced, and the high-temperature air naturally rises into the rod body 30 due to buoyancy and is in contact with the rod body 30 for heat exchange so as to achieve the heat dissipation effect.

In some embodiments, the rod bottom chassis 50 has a third length L3 in the vertical direction V, and the second length L2 is greater than the sum of the first length L1 and the third length L3. Therefore, the internal space of the rod body 30 is ensured to be greater than the sum of the internal space of the shell 10 and the internal space of the rod bottom chassis 50, the contact area of the high-temperature air and the rod body 30 is increased, the volume of low-temperature air is sufficient to circulate and supplement air into the shell 10 and the rod bottom chassis 50, and thus the heat dissipation benefit is ensured.

In some embodiments, the second length L2 of the rod body 30 is 1.5-2 times of the sum of the first length L1 and the third length L3. Therefore, sufficient low-temperature air in the rod body 30 is ensured, and the heat dissipation benefit is improved.

In some embodiments, a plurality of blower fans 40 is provided. In order to clearly describe, the plurality of blower fans 40 is respectively called as a first blower fan body 40A and a second blower fan body 40B. The first blower fan body 40A includes a first air inlet port 41A and a first air outlet port 42A. The second blower fan body 40B includes a second air inlet port 41B and a second air outlet port 42B. In such embodiments, the first blower fan body 40A is arranged at a position close to the first end 31 in the rod body 30. The second blower fan body 40B is arranged at a position close to the second end 32 in the rod body 30. The first air inlet port 41A of the first blower fan body 40A extends to a position close to the electronic assemblies 20 in the shell 10. The first air outlet port 42A is positioned in the rod body 30 and is closer to the second end 32 than the first air inlet port 41A. The second air outlet port 42B of the second blower fan body 40B is positioned in the rod body 30 and is closer to the first end 31 than the second air inlet port 41B. The second air inlet port 41B extends into the rod bottom chassis 50.

Therefore, hot air generated by electronic assemblies 20 in the shell 10 and the rod bottom bin 50 can be reliably and quickly pumped into the rod body 30 for heat exchange by increasing the number of the blower fan 40. When the high-temperature air in the shell 10 and the rod bottom chassis 50 is pumped out by the blower fan 40, the shell 10 and the rod bottom chassis 50 are depressurized relative to the rod body 30 to form a low-pressure area, so that the pressure difference among the shell 10, the rod bottom chassis 50 and the rod body 30 promotes the low-temperature air in the rod body 30 to be quickly supplemented into the shell 10 and the rod bottom chassis 50. As a result, the heat dissipation effect can be quickly generated on the electronic assemblies 20 in the shell 10 and the rod bottom chassis 50.

Although the present disclosure has been disclosed in some embodiments, it is not intended to limit the present disclosure. Any person of ordinary skill in the art may make some modifications and embellishments without departing from the spirit and scope of the present disclosure. Therefore, the scope of patent protection in the present disclosure must be determined by the scope of the claims attached to this specification.

What is claimed is:

1. An outdoor electronic device, comprising:
   a shell;
   electronic assemblies arranged in the shell;
   a rod body being of a hollow structure and comprising a first end and a second end which are reversely arranged, the first end being connected to the shell; and
   a blower fan at least partially arranged in the rod body, wherein the blower fan comprises:
   an air inlet port extending to a position close to the electronic assemblies; and
   an air outlet port positioned in the rod body;
   wherein the shell comprises a light transmitting part and a light shielding part connected to each other; the electronic assemblies comprise a first electronic assembly and a second electronic assembly; the first electronic assembly is at a position corresponding to the light transmitting part in the shell; the second electronic assembly is at a position corresponding to the light shielding part in the shell; the first electronic assembly is a light source; and the second electronic assembly is a communication device.

2. The outdoor electronic device according to claim 1, wherein the rod body is made of a high-thermal-conductivity material.

3. The outdoor electronic device according to claim 1, wherein the shell has a first length in the vertical direction; the rod body has a second length in the vertical direction; and the second length is greater than the first length.

4. The outdoor electronic device according to claim 3, further comprising a rod bottom chassis arranged at the second end of the rod body; wherein the rod bottom chassis is of a hollow structure, and the rod bottom chassis communicates with the interior of the rod body; a plurality of electronic assemblies is provided; and one electronic assembly is arranged in the rod bottom chassis.

5. The outdoor electronic device according to claim 1, wherein the light transmitting part is positioned at the first end away from the rod body relative to the light shielding part.

6. An outdoor electronic device, comprising:
   a shell;
   electronic assemblies arranged in the shell;
   a rod body being of a hollow structure and comprising a first end and a second end which are reversely arranged, the first end being connected to the shell; and a blower fan at least partially arranged in the rod body, wherein the blower fan comprises:
an air inlet port extending to a position close to the electronic assemblies; and
an air outlet port positioned in the rod body,
wherein the shell and the rod body have no open hole.

7. The outdoor electronic device according to claim 6, wherein the rod body is made of a high-thermal-conductivity material.

8. The outdoor electronic device according to claim 6, wherein a direction of connecting the first end and the second end of the rod body is a vertical direction; the shell has a first length in the vertical direction; the rod body has a second length in the vertical direction; and the second length is greater than the first length.

9. The outdoor electronic device according to claim 8, further comprising a rod bottom chassis arranged at the second end of the rod body; wherein the rod bottom chassis is of a hollow structure, and the rod bottom chassis communicates with the interior of the rod body; a plurality of electronic assemblies is provided; and one electronic assembly is arranged in the rod bottom chassis.

10. The outdoor electronic device according to claim 9, wherein the rod bottom chassis has a third length in the vertical direction, and the second length is greater than the sum of the first length and the third length.

11. The outdoor electronic device according to claim 10, wherein the second length is 1.5-2 times of the sum of the first length and the third length.

12. The outdoor electronic device according to claim 9, wherein the rod bottom chassis further comprises an open hole, which is located at the farthest position away from the shell in the vertical direction of the entire outdoor electronic device.

13. The outdoor electronic device according to claim 9, wherein the blower fan comprises a first blower fan body and a second blower fan body; the first blower fan body comprises a first air inlet port and a first air outlet port; the second blower fan body comprises a second air inlet port and a second air outlet port; the first air inlet port extends to a position close to the electronic assemblies in the shell; the first air outlet port is positioned in the rod body and is closer to the second end than the first air inlet port; the second air outlet port is positioned in the rod body and is closer to the first end than the second air inlet port; and the second air inlet port extends into the rod bottom chassis.

14. The outdoor electronic device according to claim 6, wherein the electronic assemblies are light sources.

15. The outdoor electronic device according to claim 14, wherein the shell comprises a light transmitting part; and the electronic assemblies are at positions corresponding to the light transmitting part in the shell.

16. The outdoor electronic device according to claim 6, wherein the electronic assemblies are communication devices.

17. The outdoor electronic device according to claim 16, wherein the shell comprises a light shielding part; and the electronic assemblies are at positions corresponding to the light shielding part in the shell.

18. The outdoor electronic device according to claim 6, wherein the shell comprises a light transmitting part and a light shielding part connected to each other; the electronic assemblies comprise a first electronic assembly and a second electronic assembly; the first electronic assembly is at a position corresponding to the light transmitting part in the shell; the second electronic assembly is at a position corresponding to the light shielding part in the shell; the first electronic assembly is a light source; and the second electronic assembly is a communication device.

19. The outdoor electronic device according to claim 18, wherein the light transmitting part is positioned at the first end away from the rod body relative to the light shielding part.

20. The outdoor electronic device according to claim 6, wherein the shell further comprises a partition plate; the partition plate is arranged in the shell; the electronic assemblies comprise a first electronic assembly and a second electronic assembly; and the first electronic assembly and the second electronic assembly are respectively positioned on two sides of the partition plate.

* * * * *